United States Patent [19]

Kobayashi et al.

[11] Patent Number: 4,907,059

[45] Date of Patent: Mar. 6, 1990

[54] SEMICONDUCTOR BIPOLAR-CMOS INVERTER

[75] Inventors: Kiyoshi Kobayashi, Kawasaki; Kiyofumi Ochii; Tatsuya Inatsuki, both of Yokohama, all of Japan

[73] Assignee: Kabushiki Kaisha Toshiba, Kawasaki, Japan

[21] Appl. No.: 154,528

[22] Filed: Feb. 5, 1988

Related U.S. Application Data

[63] Continuation of Ser. No. 823,779, Jan. 29, 1986, abandoned.

[30] Foreign Application Priority Data

Jan. 30, 1985 [JP] Japan .................................. 60-16139
Jan. 30, 1985 [JP] Japan .................................. 60-16140

[51] Int. Cl.$^4$ ............................................ H01L 27/02
[52] U.S. Cl. ......................................... 357/43; 357/46; 357/23.5; 357/42; 365/190; 307/446
[58] Field of Search ....................... 307/446; 365/190; 357/46, 42, 43, 23.5, 41

[56] References Cited

U.S. PATENT DOCUMENTS

| | | | |
|---|---|---|---|
| 3,753,807 | 8/1973 | Hoare et al. | 357/12 |
| 3,921,010 | 11/1975 | Griffin | 307/446 |
| 4,333,099 | 6/1982 | Tanguay et al. | 357/59 |
| 4,412,239 | 10/1983 | Iwasaki et al. | 357/12 |
| 4,487,458 | 12/1984 | Janutka | 307/570 |
| 4,613,886 | 9/1988 | Chwang | 357/42 |
| 4,719,373 | 1/1988 | Masuda et al. | 307/446 |

FOREIGN PATENT DOCUMENTS

| | | | |
|---|---|---|---|
| 67661 | 6/1982 | European Pat. Off. | 357/42 |
| 2133258 | 7/1971 | Fed. Rep. of Germany | 357/13 |
| 2449973 | 2/1980 | France | 357/42 |
| 56-125867 | 10/1981 | Japan | 357/42 |
| 59-188959 | 10/1984 | Japan | 357/43 |
| 2098799 | 5/1981 | United Kingdom | 357/42 |

OTHER PUBLICATIONS

Gaensslen et al. IBM Tech. Discl. Bull., vol. 12, No. 12, May 1970, pp. 2327-2328.
European Patent Office Search Report, Jul. 2, 1986 for Application No. 86101172.4.
2087 Elektronik, 33 (1984) Dez., No. 26, Munich, Germany
Ishikawa et al., "An Mo Gate 4K Static MOS RAM," IEEE Transactions on Electron Devices, vol. ED-27, No. 8, pp. 1586-1590, Aug. 1980.
Yu et al., "HMOS-CMOS-A Low-Power High-Performance Technology," IEEE Journal of Solid-State Circuits, vol. SC-16, No. 5, pp. 454, 10/81.

Primary Examiner—William Mintel
Attorney, Agent, or Firm—Finnegan, Henderson, Farabow, Garrett and Dunner

[57] ABSTRACT

A semiconductor device has a first semiconductor region of a first conductivity type; a second semiconductor region of a second conductivity type; an interconnection layer, containing an impurity of a second conductivity type, for connecting the first and second semiconductor regions; and a third semiconductor region of the second conductivity type which is formed in the first semiconductor region upon diffusion of the impurity from the interconnection layer to the first semiconductor region, the first and third semiconductor regions being adapted to form a p-n junction diode.

2 Claims, 10 Drawing Sheets

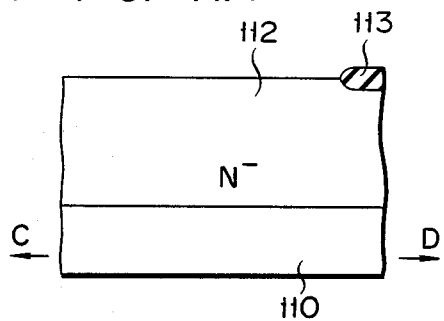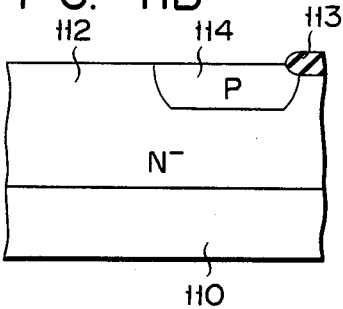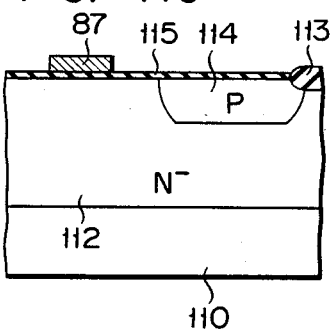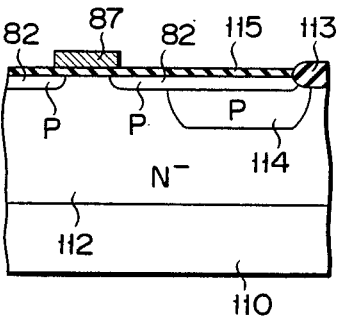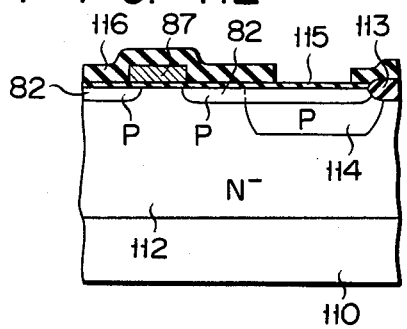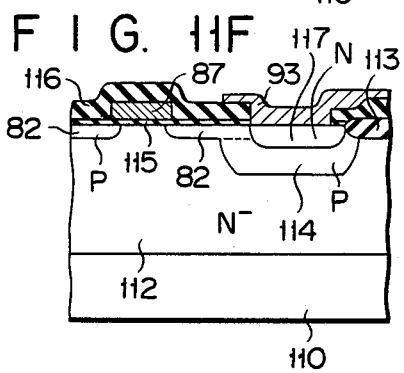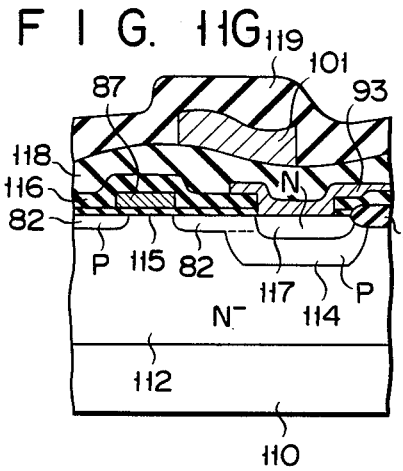

F I G. 13
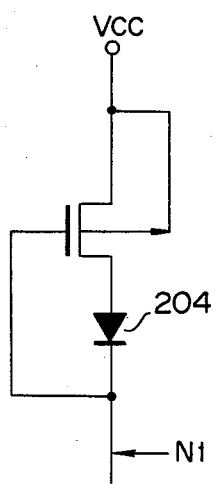
F I G. 15
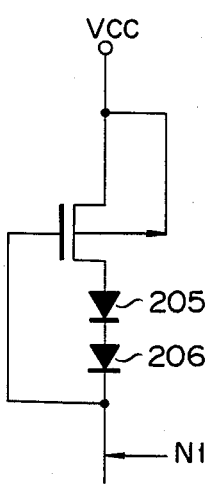
F I G. 14
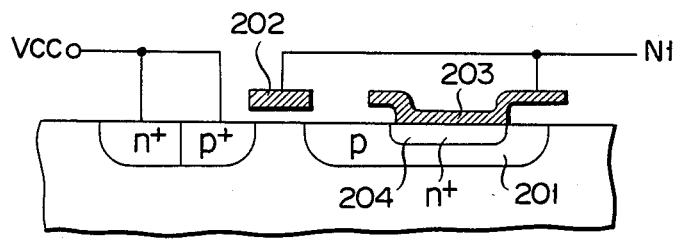
F I G. 16
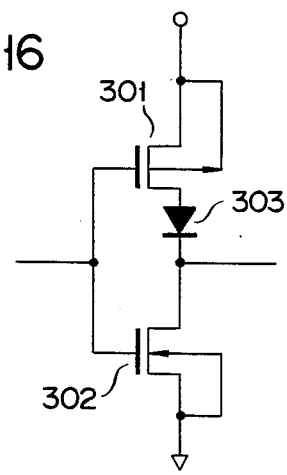

SEMICONDUCTOR BIPOLAR-CMOS INVERTER

This application is a continuation of application Ser. No. 823,779, filed Jan. 29, 1986, now abandoned.

BACKGROUND OF THE INVENTION

I. Field of the Invention

The present invention relates to a semiconductor device with an interconnection layer for interconnecting semiconductor regions of different conductivity types and a method of manufacturing the same.

II. Description of the Prior Art

Semiconductor integrated circuits, especially, semiconductor memory devices such as RAMs (Random Access Memories) and ROMs (Read Only Memories) have become increasingly miniaturized in recent years.

FIG. 1 is a circuit diagram showing the configuration of a memory cell in a conventional complementary metal-oxide-semiconductor (CMOS) static RAM memory as one of the above-mentioned RAMs. The memory cell has data storage flip-flop circuit 17 and transfer gate n-channel metal-oxide-semiconductor (MOS) transistors 23 and 24. In circuit 17, input terminals of CMOS inverter 15, consisting of p-channel MOS transistor 11 and n-channel MOS transistor 13, and CMOS inverter 16, consisting of p-channel MOS transistor 12 and n-channel MOS transistor 14, are connected to each other's respective output terminals. The source-drain path of transistor 23 is inserted between data storage node 18 of circuit 17 and bit line 20. The gate of transistor 23 is connected to word line 22. The source-drain path of transistor 24 is inserted between data storage node 19 of circuit 17 and bit line 21. The gate of transistor 24 is connected to word line 22. Transistors 11 to 14, 23, and 24 are of enhancement type.

FIG. 2 is a circuit diagram showing the configuration of an E/R type static RAM memory cell consisting of high impedance resistors and enhancement type MOS transistors. In this memory cell, high impedance load resistors 25 and 26 are used in place of transistors 11 and 12 of circuit 17 in CMOS static RAM memory cell in FIG. 1.

A comparison of the characteristics of the memory cells in FIGS. 1 and 2 is as follows. In consideration of power consumption in the standby mode and data storage holding capacity, the CMOS static RAM cell is superior to the E/R type static RAM cell. For example, power consumption of the CMOS static RAM cell is determined only by the leakage current of the respective transistors. The leakage current of transistors 13 and 14 as operating transistors in the E/R type static RAM cell must be supplied by resistors 25 and 26 as high impedance elements. In order to statically hold the data, a current which is about 100 times the leakage current of transistors 13 and 14 must be supplied to node 18 or 19. Since resistors 25 and 26 are normally made of polycrystalline silicon, it is difficult to maintain a low current level of resistors 25 and 26 when element micropatterning advances.

Operational stability (i.e., a power source margin, a noise margin, and resistance to soft error caused by alpha-rays) of the CMOS static RAM cell is superior to the E/R type static RAM cell. This is because the load elements are transistors (active elements) 11 and 12, and data storage nodes 18 and 19 can easily restore a high voltage level.

The size of the CMOS static RAM cell is larger than that of the E/R type static RAM cell. Since the cell size determines the chip size, a small cell size provides advantages in integration and manufacturing cost. When a normal transfer gate is used in the E/R type static RAM cell, the cell consists of four MOS transistors and two resistors, as shown in FIG. 2. The resistors can be easily formed above the active elements (to be described later). For this reason, the cell size can be decreased, and thus the packing density can be increased.

The CMOS static RAM cell shown in FIG. 3 consists of six MOS transistors and an isolating region required to isolate a p-type element from an n-type element. The size of the CMOS static RAM cell is larger than the E/R type static RAM cell.

FIG. 3 is a plan view of the CMOS static RAM cell. Referring to FIG. 3, reference numeral 31 denotes n-type diffusion regions constituting source and drain regions of n-channel transistors 13 and 14 (FIG. 1); and reference numeral 32 denotes p-type diffusion regions constituting source and drain regions of p-channel transistors 11 and 12 (FIG. 1). Reference numeral 33 denotes a first polycrystalline silicon layer serving as word line 22 of FIG. 1. Transfer gate transistors 23 and 24 are formed at intersection portions 34 and 35 between layer 33 and regions 31.

Reference numerals 36 and 37 denote first polycrystalline silicon layers. Transistor 13, as part of CMOS inverter 15, is formed at intersection portion 38 between layer 36 and region 31, and transistor 14, as part of CMOS inverter 16, is formed at intersection portion 39 between layer 37 and region 31. Furthermore, transistor 11, as part of inverter 15, is formed at intersection portion 40 between layer 36 and region 32, and transistor 12, as part of inverter 16, is formed at intersection portion 41 between layer 37 and region 32.

A right descending hatched line portion in FIG. 3 is second n-type polycrystalline silicon layer 42 connected to ground potential Vss and is connected to region 31 through contact hole 43. Left descending hatched line portions are aluminum wiring region 44 to 47. Layer 44 is one bit line which is connected to region 31 through contact hole 48. Layer 45 is the other bit line connected to region 31 through contact hole 49. Layer 46 is used as an interconnection layer for connecting regions 31 and 32 through contact holes 50 and 51, and to layer 37 as a gate wiring of p-channel MOS transistor 12 through contact hole 52. Layer 47 is used as an interconnection layer for connecting regions 31 and 32 through contact holes 53 and 54 and to layer 36 as the gate wiring of p-channel MOS transistor 11 through contact hole 54.

FIG. 4 is a plan view showing a pattern of an E/R type static RAM cell. Reference numeral 61 denotes n-type diffusion regions serving as source and drain regions of n-channel MOS transistors 13, 14, 23, and 24 (FIG. 2). Reference numeral 62 denotes a first polycrystalline silicon layer serving as word line 22 of FIG. 2. Transfer gate transistors 23 and 24 (FIG. 2) are respectively formed at intersection portions 63 and 64 between layer 62 and region 61.

Reference numerals 65 and 66 also denote first polycrystalline silicon layers. Drive transistors 13 and 14 in FIG. 2 are respectively formed at intersection portions 67 and 68 between layers 65 and 66 and region 61.

A right descending hatched line portion in FIG. 4 is second polycrystalline silicon layer 69 connected to power source voltage Vcc, and part thereof constitutes resistors 25 and 26 in FIG. 2. Left descending hatched line portions are aluminum wiring layers 70, 71, and 72. Layers 71 and 72 constitute a pair of bit lines, as in FIG.

2. Layer 70 is connected to ground potential Vss and to region 61 through contact hole 73.

A cell size of the static RAM cells will be described when the cells are integrated. In the CMOS static RAM cell of FIG. 3, a power source Vss line is second polycrystalline silicon layer 42. A wiring density of aluminum wiring layers 44 to 47 is four per cell. A second polycrystalline silicon layer density is one per cell. On the other hand, in the E/R type static RAM, the two bit lines are aluminum wiring layers, and the high impedance resistor layers are by the second polycrystalline silicon layer regions which are formed above the active elements.

When the area of the CMOS static RAM cell in FIG. 3 is compared with that of the E/R static RAM cell in FIG. 4, its cell area is about 141% that of the cell in FIG. 4. The reason for the increase in cell size in FIG. 3 is the use of aluminum wiring layers. As is apparent from FIGS. 3 and 4, four aluminum wiring layers are used in the cell in FIG. 3, while three aluminum wiring layers are used in the cell in FIG. 4. The width of the CMOS static RAM cell is determined by the number of aluminum wiring layers in the cell. Thus, it is very effective and desirable to decrease the number of aluminum wiring layers for reduction in cell size.

In the E/R type static RAM cell, on the other hand, it is very important to obtain a predetermined length to polycrystalline silicon layers. In the E/R type static RAM cell specifically, a decrease in the cell size in the longitudinal direction, that is, the direction of the length of the aluminum wiring layers is limited.

As described above, the CMOS static RAM cell is superior to the E/R type static RAM cell when various characteristics are taken into consideration, but the CMOS static RAM has limitations in cell size reduction. The E/R type static RAM cell generally has poorer electrical characteristics and limitations in cell size reduction.

SUMMARY OF THE INVENTION

It is an object of the present invention to provide a semiconductor device with a decreased cell size and good electrical characteristics.

It is another object of the present invention to provide a method of manufacturing such a semiconductor device.

According to a first embodiment of the present invention, there is provided a semiconductor device comprising a first semiconductor region of a first conductivity type; a second semiconductor region of a second conductivity type; an interconnection layer, containing an impurity of a second conductivity type, for connecting the first and second semiconductor regions; and a third semiconductor region of the second conductivity type which is formed in the first semiconductor region upon diffusion of the impurity from the interconnection layer to the first semiconductor region, the first and third semiconductor regions being adapted to form a p-n junction diode.

In the semiconductor device of the present invention, the first semiconductor region can be a drain region of a first MOS transistor and the second semiconductor region can be a drain region of a second MOS transistor, to constitute a CMOS inverter. In this case, the gate electrodes of the first and second MOS transistors belong to a layer different from the interconnection layer.

According to a second embodiment of the present invention, there is provided a method of manufacturing a semiconductor device, comprising the steps of: forming a first semiconductor region of a first conductivity type in a surface region of a first semiconductor layer of a second conductivity type formed in a substrate; forming a second semiconductor region of the second conductivity type in a surface region of a second semiconductor layer of the first conductivity type formed in the substrate; forming an insulating film to cover an entire surface of the substrate which includes the first and second semiconductor regions; selectively etching the insulating film and forming openings respectively communicating with the first and second semiconductor regions; forming a conductive material layer containing an impurity of the second conductivity type to cover an entire surface of the substrate, doping the impurity of the second conductivity type in the conductive material layer through the opening to form a third semiconductor region of the second conductivity type, thus forming a p-n junction diode consisting of the first semiconductor region and the third semiconductor region; and patterning the conductive material layer to form an interconnection layer for connecting the first and second semiconductor regions.

According to the present invention, the first semiconductor region of the first conductivity type and the second semiconductor region of the second conductivity type are connected by the interconnection layer which is made of a conductive material containing an impurity of the second conductivity type, in particular, a polycrystalline silicon. The number of aluminum interconnection layers in the memory cell of the present invention can be decreased as compared with that of the conventional memory cell. Therefore, the cell size can be decreased while good electrical characteristics are maintained.

BRIEF DESCRIPTION OF THE DRAWINGS

FIGS. 10A to 11G are respectively sectional views for explaining the steps in manufacturing the CMOS static RAM cell in FIG. 5;

FIGS. 13 and 14 are respectively a circuit diagram and a sectional view of a pull-up element of Example 3 according to the present invention;

FIG. 15 is a circuit diagram showing a modification of Example 3 according to the present invention;

FIG. 16 is a circuit diagram of a CMOS inverter of Example 4 according to the present invention.

DETAILED DESCRIPTION OF PREFERRED EMBODIMENTS

Examples of various semiconductor devices which adapt the present invention will be described in detail with reference to the accompanying drawings.

EXAMPLE 1

Figure 1:
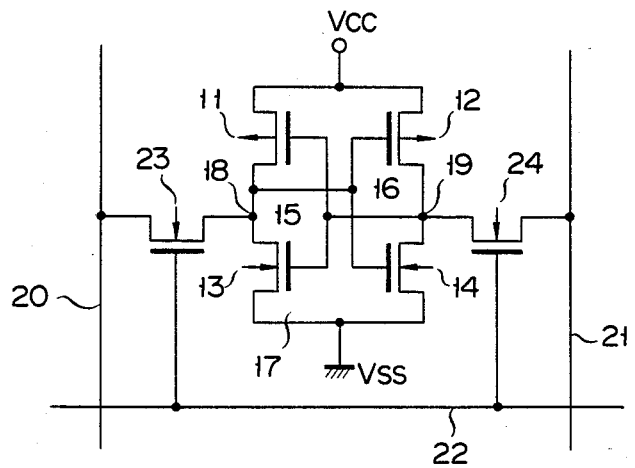
FIG. 1 is a circuit diagram of a conventional CMOS static RAM cell.
Figure 2:
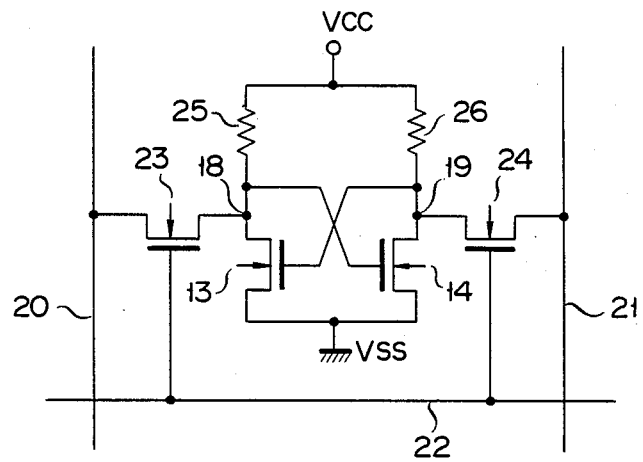
FIG. 2 is a circuit diagram of a conventional E/R type static RAM cell.
Figure 5:
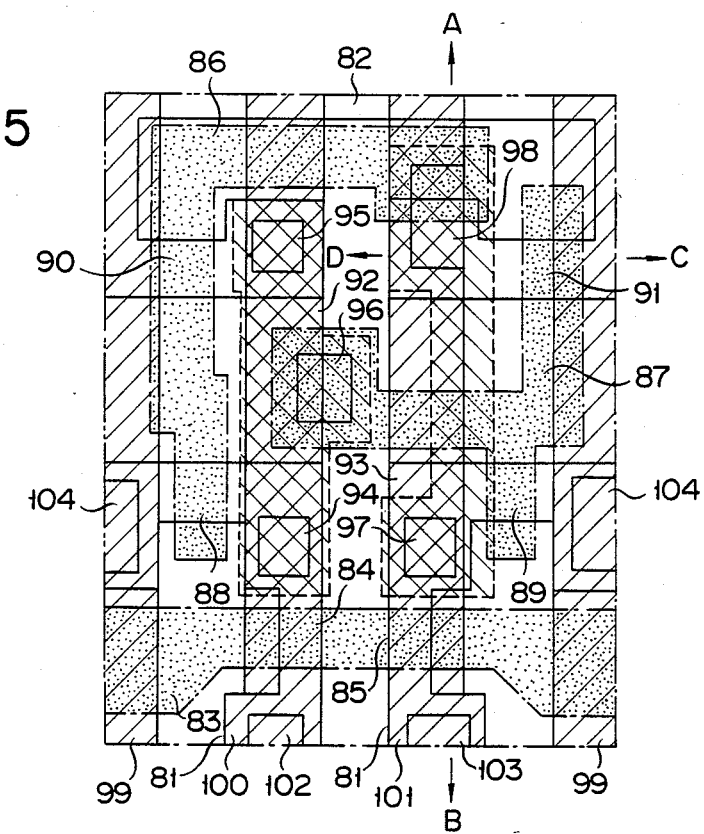
FIG. 5 is a plan view showing a pattern of a CMOS static RAM cell according to Example 1 of the present invention.

FIG. 5 is a plan view showing a pattern of one memory cell when the present invention is applied to a CMOS static RAM cell. The cell is an integrated CMOS cell with elements like those in FIG. 1. Referring to FIG. 5, reference numeral 81 denotes n-type diffusion regions, serving as source and drain regions of n-channel transistors 13, 14, 23, and 24. Reference numeral 82 denotes p-type diffusion regions serving as source and drain regions of p-channel transistors 11 and 12. Reference numeral 83 denotes a first polycrystalline silicon layer serving as word line 22. Transfer gate transistors 23 and 24 are respectively formed at intersection portions 84 and 85 between layer 83 and regions 81.

Reference numerals 86 and 87 also denote first polysilicon layers, respectively. N-channel MOS transistors 13 and 14 constituting CMOS inverters 15 and 16 are formed at intersection portions 88 and 89 between regions 81 and layers 86 and 87. P-channel MOS transistors 11 and 12 constituting CMOS inverters 15 and 16 are respectively formed at intersection portions 90 and 91 between regions 82 and layers 86 and 87.

Right descending hatched line portions are second polycrystalline silicon layers 92 and 93, containing an n-type impurity. Layer 92 is connected to regions 81 and 82 through contact holes 94 and 95, respectively, and to layer 87 through contact hole 96. Layer 93 is connected to region 81 through contact hole 97 and to parts of layer 86 and region 82 through contact hole 98. Left descending hatched line portions are aluminum wiring layers 99 to 101. Layer 100 is connected to one bit line and to part of region 81 through contact hole 102. Layer 101 is connected to the other bit line and to part of region 81 through contact hole 103. Layer 99 is connected to ground potential Vss and is connected to region 81 through contact hole 104.

Figure 3:
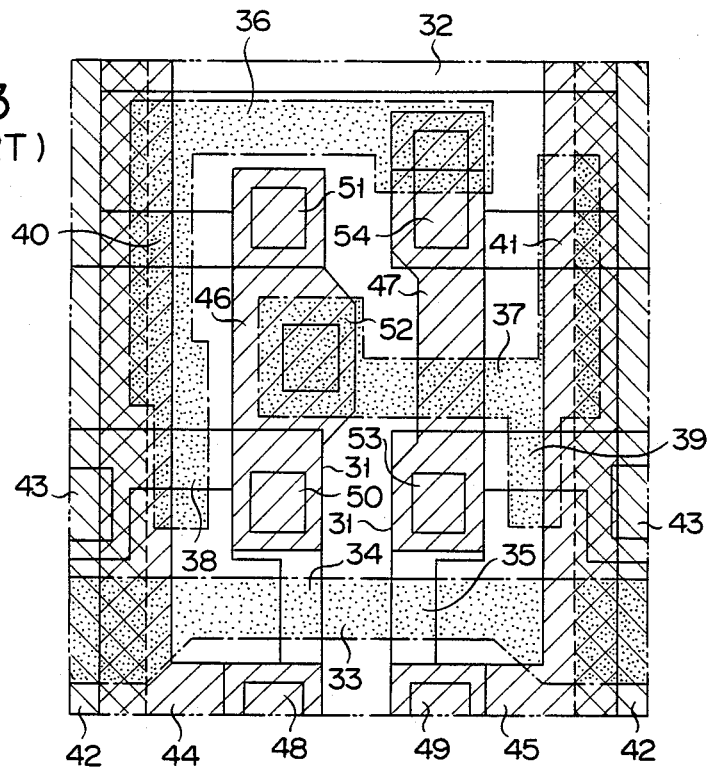
FIG. 3 is a plan view showing a pattern of the CMOS static RAM cell in FIG. 1.
Figure 4:
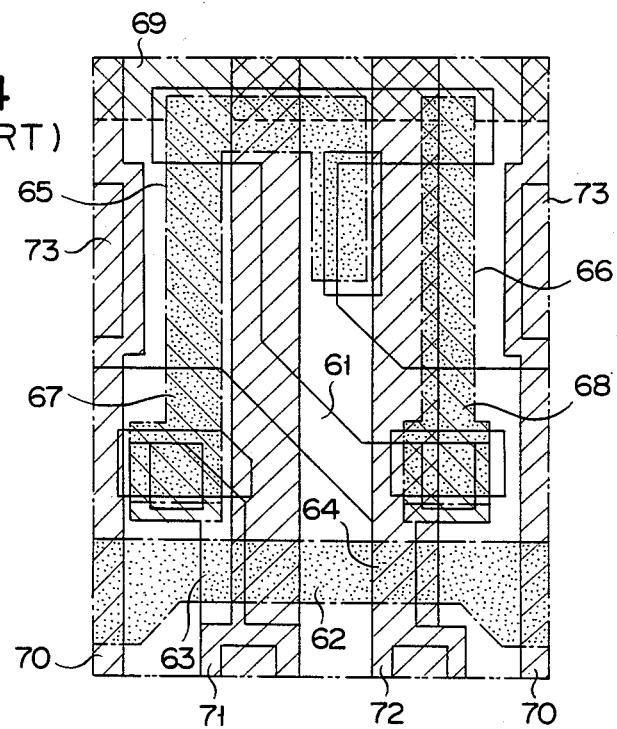
FIG. 4 is a plan view showing a pattern of the E/R type static RAM cell in FIG. 2.

In this cell, the drains of the p- and n-channel MOS transistors constituting inverters 15 and 16 are connected not by the aluminum wiring layers but by second polycrystalline silicon layers 92 and 93 containing the n-type impurity. In addition, the Vss wiring layer is substituted from the conventional second polycrystalline silicon layer to aluminum wiring layer 99. As a result, three aluminum wiring layers and two second polycrystalline silicon layers are used, and the numbers of wiring layers of different materials are close, thus the cell size can be decreased as compared with the conventional CMOS arrangement in FIG. 3. The decrease in aluminum wiring layers is from four layers to three, thus the cell size can be decreased to be about 88% that of the conventional memory cell.

Figure 6:
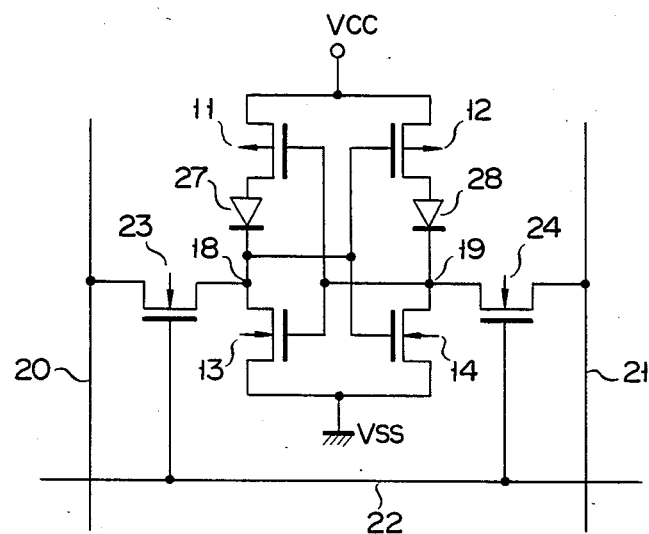
FIG. 6 is an equivalent circuit diagram of FIG. 5.

In the cell with the pattern shown in FIG. 5, the drains of the p-channel MOS transistors are made of regions 82, which are then connected to regions 81 as the drains of the n-channel MOS transistors through layer 92. For this reason, p-n junction diodes are formed between regions 82 and layer 92. As shown in an equivalent circuit of this cell in FIG. 6, p-n junction diodes 27 and 28 are respectively formed between the drains of transistors 11 and 13 and the drains of transistors 12 and 14 as the polarities of the diodes are shown therein.

The electrical characteristics of the CMOS static RAM cell having diodes 27 and 28 between p- and n-channel MOS transistors will be described hereinafter.

Figure 7:
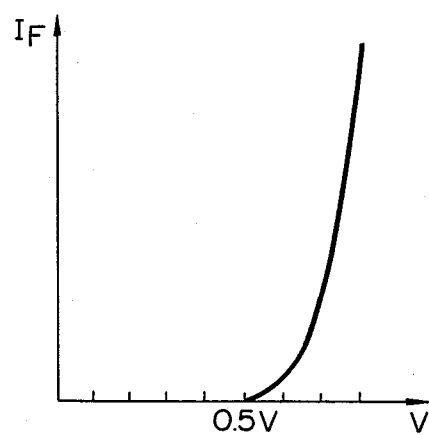
FIGS. 7 to 9 are respectively graphs for explaining the characteristics of the CMOS static RAM cell in FIG. 5.

In a memory cell (FIG. 1) without the above diodes, ohmic conditions are established between p- and n-type diffusion regions at data storage nodes 18 and 19. However, in the memory cell (FIG. 5) in Example 1, diode operation influences potentials at or potential changes in data storage nodes 18 and 19. In other words, the voltage (V)-current ($I_F$) characteristics for forward biasing of the p-n junction diode are as shown in FIG. 7. When a large current flows in accordance with equation $I_F = I_0(e^{qV/kt} - 1)$, about a 0.7 V voltage drop occurs in the diode. A DC high voltage level in the stable conditions at nodes 18 and 19 is increased to a level which satisfies $I_F > I$, where I is the leakage current at nodes 18 and 19. The leakage current at nodes 18 and 19 is a sum of the leakage current in n-type diffusion regions 81 and an off current of n-channel MOS transistors 13 and 14 and is given as about $10^{-14}$ A/cell.

Figure 8:
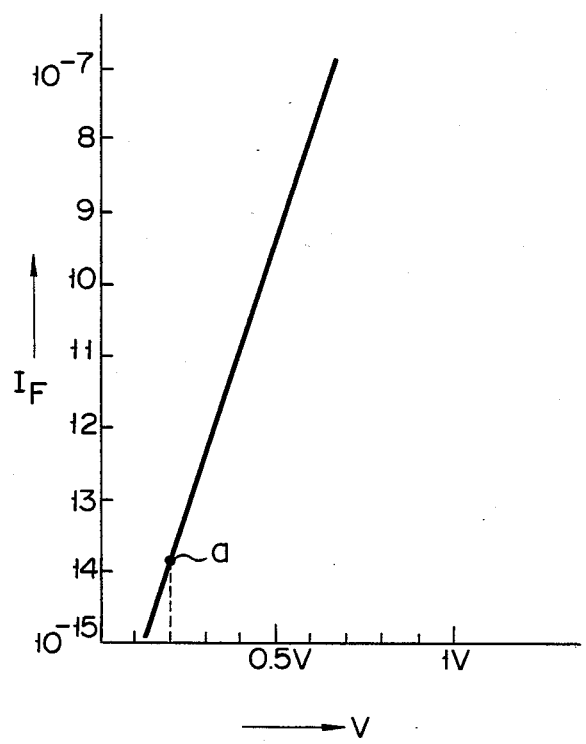

Forward current $I_F$ in FIG. 7 is plotted in a logarithmic coordinate system, as shown in FIG. 8. A potential corresponding to $I_F = 10^{-14}$ A is a potential (i.e., 0.2 V) at point a. Therefore, the DC high potential level at nodes 18 and 19 is set at a potential lower by 0.2 V from power source voltage Vcc. In this case, in p-channel MOS transistors 11 and 12, the gates of which are controlled in response to a signal from a higher voltage one of data storage nodes 18 and 19 in transistors 11 and 12, gate-source voltage $V_{GS}$ is about 0.2 V and a drain-source voltage is substantially the same as Vcc. In the standby state, at such a $V_{GS}$ level, the p-channel MOS transistor can be turn on without any trouble.

Figure 9:
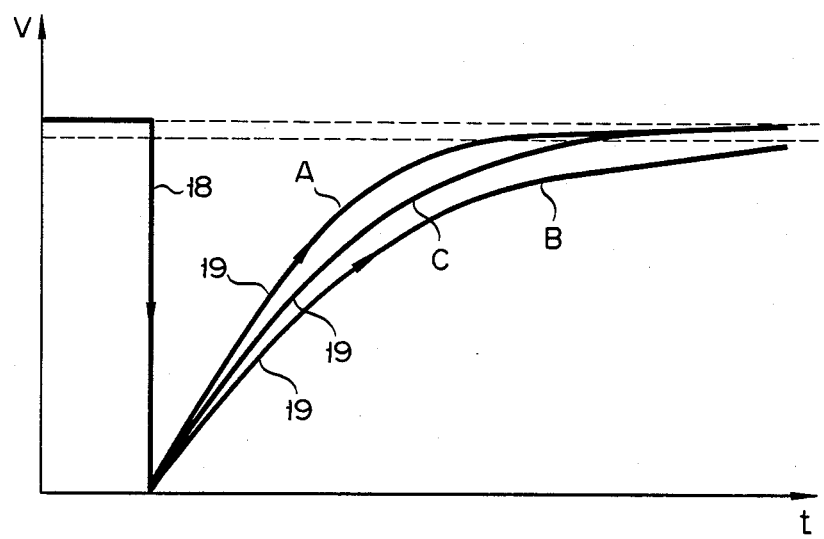

The AC characteristics of the memory cell (Example 1) with diodes 27 and 28 will now be described. FIG. 9 is a graph showing qualitative rising characteristics at node 19 when a signal of an illustrated waveform is supplied to node 18. Curve A shows rising characteristics at node 19 in the conventional CMOS static RAM cell in FIG. 1. Curve B shows rising characteristics at node 19 in the CMOS static RAM cell in Example 1. Curve A is determined by resistance characteristics of the p-channel MOS transistor. Curve B is determined by resistance characteristics of the p-channel MOS transistor and forward biasing characteristics of the diode. For this reason, the rising characteristics at node 19 in Example 1 are slightly degraded as compared with those of the conventional RAM cell. However, the rising characteristics in example 1 are sufficiently good as compared with those in the conventional E/R type static RAM cell. Therefore, data storage nodes can be sufficiently stable.

Figure 10A:
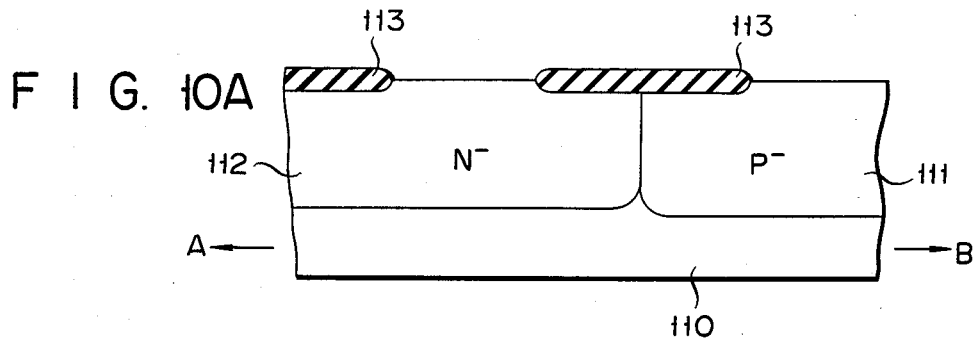

A method of manufacturing an integrated circuit using the memory cells of Example 1 will be described hereinafter. FIGS. 10A to 10G and FIGS. 11A to 11G are sectional views for explaining the steps in this manufacturing process. FIGS. 10A to 10G are sectional views of the cell in FIG. 5, taken along the line A-B, and FIGS. 11A to 11G are sectional views thereof taken along the line C-D. The same reference numerals in FIGS. 10A to 11G denote the same parts as in FIG. 5. As shown in FIGS. 10A and 11A, p- or n-type semiconductor substrate 110 is prepared as a support substrate, with p⁻-type semiconductor region 111 as a prospective region for source and drain of an n-channel MOS transistor, and n⁻-type semiconductor region 112 as a prospective region for source and drain of a p-channel MOS transistor, formed thereon. Subsequently, a surface portion of substrate 1 which excludes the prospective source, drain, and channel regions of MOS transistors is selectively oxidized to form field insulating film 113.

Figure 10B:
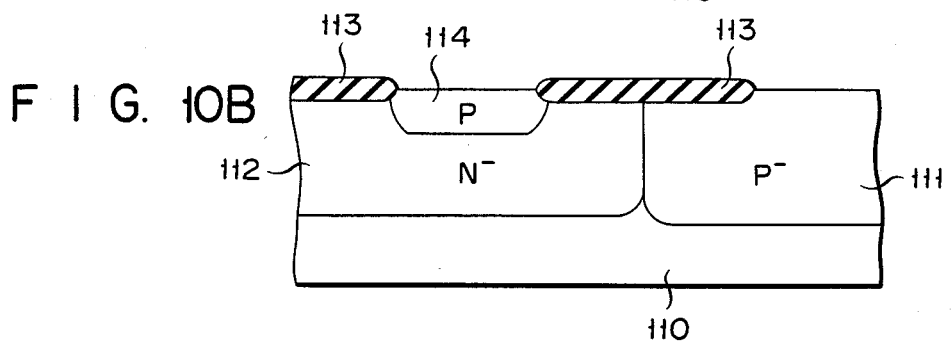

As shown in FIG. 10B and 11B, p-type impurity ions are implanted in a region surrounding a prospective p-n junction diode region. The doped ions are diffused by annealing, and p-type region 114 is formed.

Figure 10C:
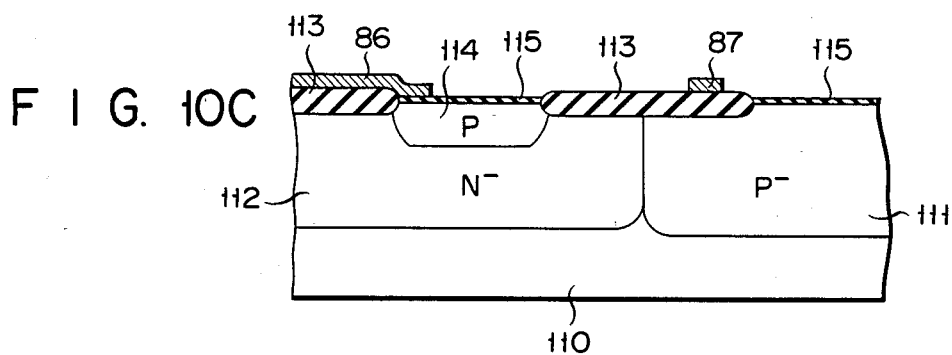

As shown in FIG. 10C and 11C, gate oxidation is performed to form gate oxide film 115, and a first polycrystalline silicon layer is deposited thereon. The first polycrystalline silicon layer is patterned to form polycrystalline silicon layers 83, 86, and 87, serving as gate electrodes of the MOS transistors.

Figure 10D:
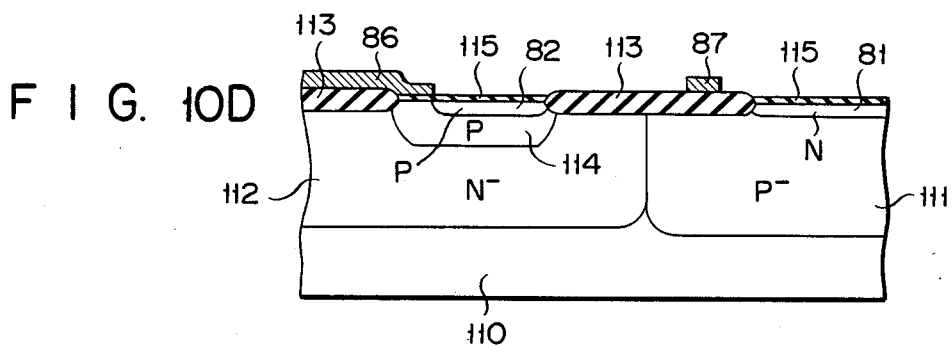

As shown in FIGS. 10D and 11D, p- or n-type impurity ions are selectively implanted in the prospective source and drain regions of the p- and n-channel MOS transistors to form regions 81 and 82.

Figure 10E:
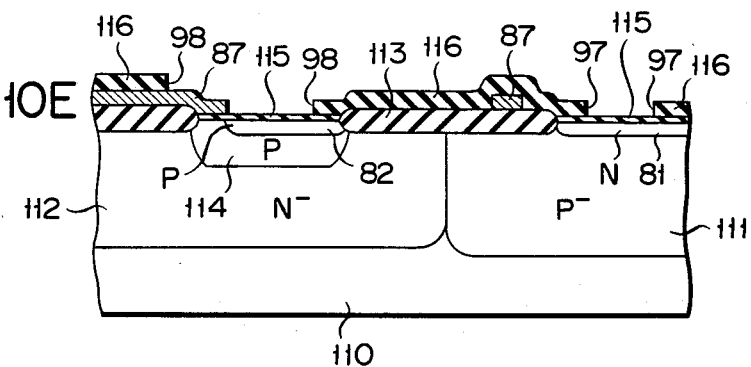

As shown in FIG. 10E and 11E, silicon oxide film 116 is formed by, for example, CVD (Chemical Vapor Deposition) to cover the entire surface of the structure. Film 116 is t hen selectively etched to form contact holes 97 and 98.

Figure 10F:
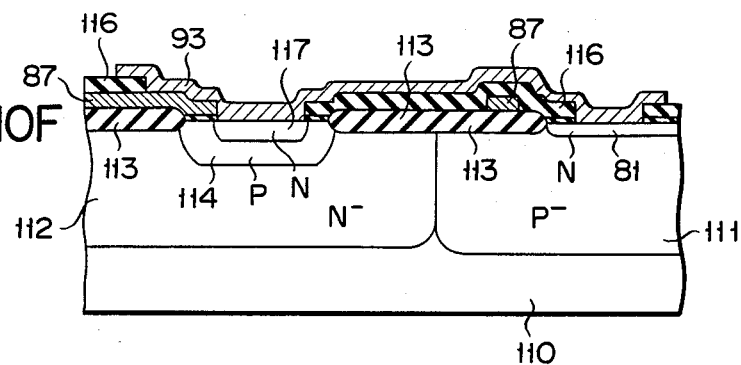
Figure 10G:
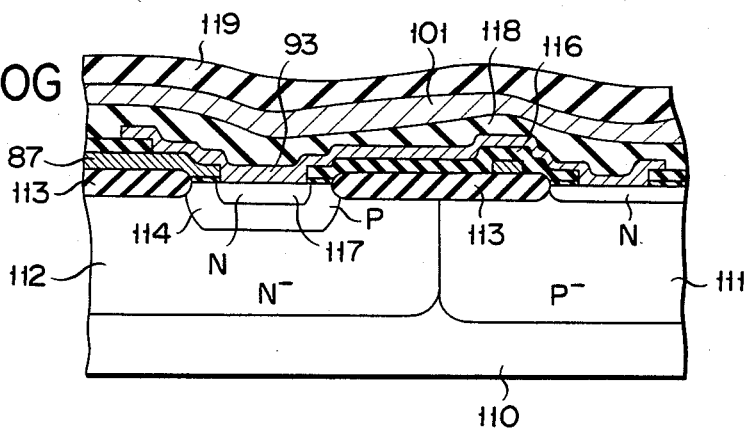

Thereafter, film 115 on the surface of region 114 is selectively etched. As shown in FIGS. 10F and 11F, a second polycrystalline silicon layer is then deposited to cover the entire surface. An n-type impurity is doped by ion implantation or phosphorus diffusion in this polycrystalline silicon layer. The doped silicon layer is then selectively patterned to form second polycrystalline silicon layers 92 and 93. In this case, the n-type impurity contained in layer 93 is diffused in region 114 to form n-type diffusion region 117. Region 117, together with region 114, constitutes diode 27 or 28.

Thereafter, insulating interlayer 118 is formed by, for example, CVD, and is etched to form contact holes. Aluminum is then deposited to cover the entire surface and is patterned to form aluminum wiring layer 101. Protective film 119 is then formed on the entire surface to prepare the RAM cell of Example 1.

EXAMPLE 2

In Example 1, the n-type impurity is diffused from layer 92 for connecting region 82 to region 81, constituting the drain region of the n-channel MOS transistor to region 82, constituting the drain region of the p-channel MOS transistor, thereby forming the p-n junction diode. In example 2, impurity concentrations of p- and n-type diffusion regions constituting the p-n junction diode are set to be higher than $10^{19}$ cm$^{-3}$. The p-n junction diode serves as an Esaki diode, the forward biasing characteristics of which provide a tunnel effect.

Figure 12:
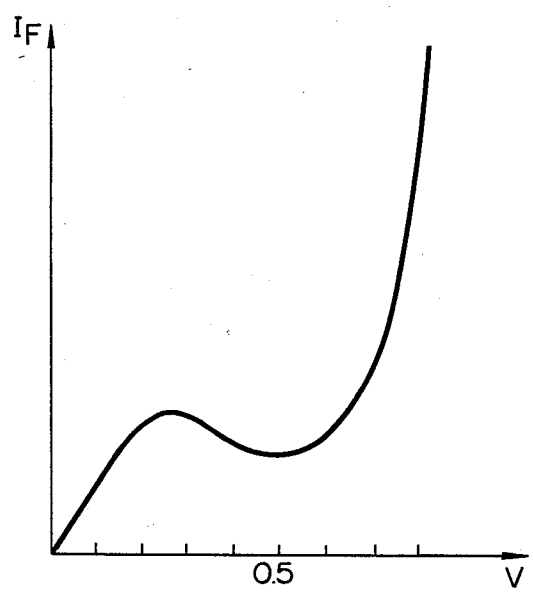
FIG. 12 is a graph showing IV characteristics of an Esaki diode.

Since the Esaki diode has forward biasing characteristics as shown in FIG. 12, a large current flow through the diode in a low voltage region. Therefore, low-voltage characteristics of the RAM cell can be improved as compared with the normal p-n junction diode. A resistance at the low voltage region is decreased. For this reason, a high voltage level at nodes 18 and 19 can be increased to the power source voltage Vcc, in the same manner as in the conventional CMOS static RAM cell, and thus a threshold voltage of the p-channel MOS transistor can be set to be a normal value.

The AC rising characteristics of the Esaki diode are improved as compared with the RAM cell with a normal p-n junction diode (curve B), as indicated by curve C in FIG. 9. Attention need not be paid to the negative resistance or bottom current characteristics of the Esaki diode.

The CMOS static RAM cell in Example 2 can be manufactured by the same process as that in Example 1, except that the impurity concentrations of regions 117 and 114 are controlled to be higher than $10^{19}$ cm$^{-3}$.

The present invention is exemplified by Examples 1 and 2 of CMOS static RAM cells. However, the present invention is not limited to the CMOS static RAM cells but can be extended to various types of semiconductor devices. Some other examples will be described hereinafter.

EXAMPLE 3

Example 3 exemplifies a pull-up element which adapts the present invention.

As shown in FIGS. 13 and 14, drain 201 and gate 202 of a PMOS are connected by interconnection layer 203 containing an n-type impurity. THe impurity is diffused from the interconnection layer to drain 201, forming a p-n junction diode 204 therein. In the pull-up element in FIGS. 13 and 14, a potential at node N1 can be decreased by a voltage drop effected by a diode, as compared with a structure without a diode.

As shown in FIG. 15, the pull-up element may have series-connected diodes 205 and 206.

EXAMPLE 4

Example 4 exemplifies a CMOS inverter which adapts the present invention.

As shown in FIG. 16, the drains of p- and n-channel MOS transistors 301 and 302 constituting the CMOS inverter are connected by a polycrystalline silicon interconnection layer containing an n-type impurity. The impurity is doped from the interconnection layer to the drain of transistor 301 to form p-n junction diode 303.

EXAMPLE 5

Example 5 exemplifies a bipolar-CMOS inverter which adapts the present invention.

Figure 17:
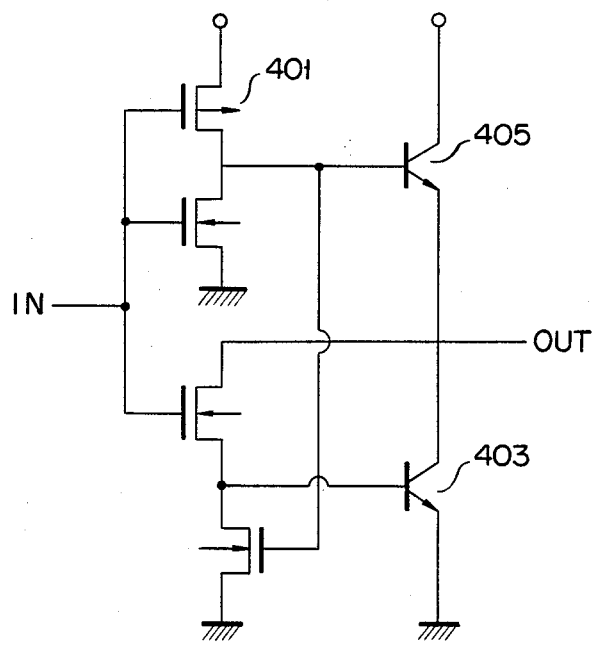
FIGS. 17 and 18 are respectively a circuit diagram and a sectional view of a bipolar-CMOS inverter of Example 5 according to the present invention.
Figure 18:
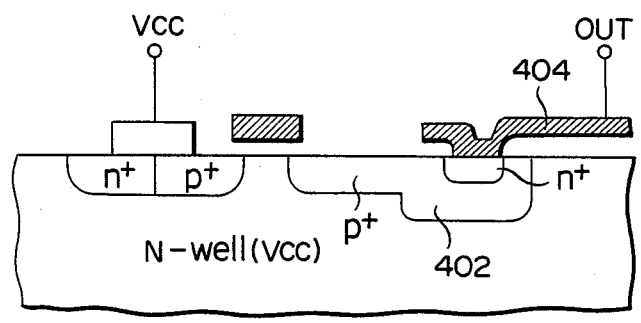

As shown in FIGS. 17 and 18, drain 402 of p-channel MOS transistor 401 and the collector of bipolar transistor 403 are connected by interconnection layer 404 of polycrystalline silicon containing an n-type impurity. The impurity is doped from layer 404 to drain 402 to form a p-n junction diode. The p-n junction diode serves as an emitter-base junction of transistor 405. The bipolar-CMOS inverter requires a larger number of elements as compared with the CMOS inverter. However, as shown in FIGS. 17 and 18, the present invention can simplify the pattern layout of the bipolar-CMOS inverter and decrease the base capacity thereof, thus guaranteeing high-speed operation of the device.

What is claimed is:

1. A semiconductor device comprising:
   a first semiconductor region of a first conductivity type, said first semiconductor region constituting a drain region of a metal-oxide-semiconductor transistor and a base region of a first bipolar transistor;
   a second semiconductor region of a second conductivity type, said second semiconductor region constituting a collector region of a second bipolar transistor;
   an interconnection layer, containing an impurity of said second semiconductor type, for connecting said first and second semiconductor regions; and
   a third semiconductor region of said second semiconductor type formed in said first semiconductor region upon diffusion of the impurity from said interconnection layer to said first semiconductor region, said third semiconductor region constituting an emitter region of said first bipolar transistor.

2. A semiconductor device according to claim 1 wherein said interconnection layer comprises polycrystalline silicon.

* * * * *